(12) United States Patent
Szarvas et al.

(10) Patent No.: US 8,068,263 B2
(45) Date of Patent: Nov. 29, 2011

(54) HOLOGRAPHIC STORAGE SYSTEM WITH REDUCED NOISE

(75) Inventors: Gabor Szarvas, Budapest (HU);
Szabolcs Kautny, Budapest (HU);
Krisztian Banko, Ajka (HU); Zokan Karpati, Pecs (HU)

(73) Assignee: Thomson Licensing, Boulogne-Billancourt (FR)

( * ) Notice: Subject to any disclaimer, the term of this patent is extended or adjusted under 35 U.S.C. 154(b) by 415 days.

(21) Appl. No.: 12/384,614

(22) Filed: Apr. 7, 2009

(65) Prior Publication Data
US 2009/0262405 A1 Oct. 22, 2009

(30) Foreign Application Priority Data

Apr. 17, 2008 (EP) ..................... 08154708

(51) Int. Cl.
*G03H 1/10* (2006.01)
*G03H 1/16* (2006.01)
(52) U.S. Cl. ........................... 359/10; 359/29
(58) Field of Classification Search ............ 359/10, 359/11, 29
See application file for complete search history.

(56) References Cited

U.S. PATENT DOCUMENTS

| | | | |
|---|---|---|---|
| 6,147,782 A | 11/2000 | Daiber et al. | |
| 6,766,958 B1 | 7/2004 | Roh | |
| 7,835,048 B2 * | 11/2010 | Szarvas et al. | 359/10 |
| 2007/0104069 A1 | 5/2007 | Fukumoto et al. | |

FOREIGN PATENT DOCUMENTS

| | | |
|---|---|---|
| EP | 1912212 | 4/2008 |
| WO | WO2006/003077 | 1/2006 |

OTHER PUBLICATIONS

Search Report dated Sep. 24, 2008.

* cited by examiner

*Primary Examiner* — Alessandro Amari
(74) *Attorney, Agent, or Firm* — Robert D. Shedd; Joseph J. Opalach; Jerome G. Schaefer

(57) ABSTRACT

An apparatus for reading from and/or writing to transmission type holographic storage media is proposed, and more specifically a coaxial type apparatus for reading from and/or writing to transmission type holographic storage media with two or more reference beams, which has an improved Signal to Noise Ratio. The apparatus has a coaxial arrangement of two or more reference beams and an object beam or a reconstructed object beam. The reference beams are arranged on a circle around the object beam or the reconstructed object beam in a Fourier plane of the apparatus behind the holographic storage medium. A mirror is located in or close to this Fourier plane, which is designed such that it reflects the object beam or the reconstructed object beam without reflecting the reference beams.

8 Claims, 5 Drawing Sheets

HOLOGRAPHIC STORAGE SYSTEM WITH REDUCED NOISE

This application claims the benefit, under 35 U.S.C. §119 of EP Patent Application 08154708.5, filed 17 Apr. 2008.

FIELD OF THE INVENTION

The present invention relates to an apparatus for reading from and/or writing to holographic storage media, and more specifically to a coaxial type apparatus for reading from and/or writing to holographic storage media with two or more reference beams, which has an improved Signal to Noise Ratio.

BACKGROUND OF THE INVENTION

In holographic data storage digital data are stored by recording the interference pattern produced by the superposition of two coherent laser beams, where one beam, the so-called 'object beam', is modulated by a spatial light modulator and carries the information to be recorded. The second beam serves as a reference beam. The interference pattern leads to modifications of specific properties of the storage material, which depend on the local intensity of the interference pattern. Reading of a recorded hologram is performed by illuminating the hologram with the reference beam using the same conditions as during recording. This results in the reconstruction of the recorded object beam.

One advantage of holographic data storage is an increased data capacity. Contrary to conventional optical storage media, the volume of the holographic storage medium is used for storing information, not just a few layers. One further advantage of holographic data storage is the possibility to store multiple data in the same volume, e.g. by changing the angle between the two beams or by using shift multiplexing, etc. Furthermore, instead of storing single bits, data are stored as data pages. Typically a data page consists of a matrix of light-dark-patterns, i.e. a two dimensional binary array or an array of grey values, which code multiple bits. This allows to achieve increased data rates in addition to the increased storage density. The data page is imprinted onto the object beam by the spatial light modulator (SLM) and detected with a detector array.

In WO2006/003077 a 12f reflection type coaxial holographic storage arrangement with three confocally arranged Fourier planes is shown. In this arrangement the object beam and the reference beams are coupled in and out at the first and third Fourier planes, respectively. The reference beams are small spots in these planes. More precisely, they form diffraction patterns, similar to the Airy pattern. This arrangement is a so-called common aperture arrangement, because at the object plane and the image plane the object beam and the reference beams fill out the same area of the aperture. The beams fill out the entire aperture of the objectives. The disclosed arrangement allows to apply shift multiplexing, reference scanning multiplexing, phase coded multiplexing, or a combination of these multiplexing schemes. The reference beams are a pair (or pairs of) half cone shaped beams. The tips of the pair or pairs of half cone shaped reference beams form two lines along a diameter at the Fourier planes of the object beam.

Theoretically, for infinite holograms the shift selectivity curve is a sinc(x) like function. See, for example, G. Barbastathis et al.: "Shift multiplexing with spherical reference waves", Appl. Opt. 35, pp 2403-2417. At the so-called Bragg distances the diffraction efficiencies of the shifted hologram are zero. In WO2006/003077 the distances between the tips of the reference beams along the two lines correspond to these Bragg distances. The interhologram crosstalk between the multiplexed holograms in theory is negligible at the Bragg distances. Assuming infinite diameter holograms there are selective and non-selective directions for the shift multiplexing. See again the article of G. Barbastathis et al. The selective direction is the direction of the line formed by the tips of the reference beams. In the so-called non-selective direction, which is orthogonal to the selective direction in the plane of the holograms, the shift distance is infinite. However, in a real storage system the volume of the hologram is finite. Practically, the order of magnitude of the hologram volume is about $(0.4-0.6) \times (0.4-0.6) \times (0.2-0.6)$ mm$^3$. Detailed investigations have shown that there are large discrepancies between the shift selectivity curves of infinite and finite holograms. There are no Bragg distances in case of finite volume holograms. See Z. Karpati et al.: "Shift Selectivity Calculation for Finite Volume Holograms with Half-Cone Reference Beams", Jap. J. Appl. Phys., Vol. 45 (2006), pp 1288-1289. Using finite volume holograms the order of magnitude of the selectivity is similar in both directions. See, for example, Z. Karpati et al.: "Selectivity and tolerance calculations with half-cone reference beam in volume holographic storage", J. Mod. Opt., Vol. 53 (2006), pp 2067-2088. The presence of selectivity in both directions allows two-dimensional multiplexing. A problem is that the interhologram cross-talk is too high in the non-selective direction. This limits the achievable number of multiplexed holograms in this direction, and as a consequence limits the total capacity of the holographic storage medium.

In order to obtain an improved selectivity, in the not yet published European Patent Application EP 06122233.7 an apparatus for reading from and/or writing to a reflection-type holographic storage medium with a coaxial arrangement of three or more reference beams and an object beam or a reconstructed object beam is described. In this apparatus the reference beams are arranged on a circle or an ellipse around the object beam in a Fourier plane of the apparatus. In order to separate a reconstructed object beam from the reflected reference beams an outcoupling filter is used, which blocks the reflected reference beams and passes the reconstructed object beam through a central aperture.

The main advantage of the various coaxial holographic storage systems is their insensitivity against environmental disturbances, because the object and reference beams propagate along the same optical path. Use of a reflection type holographic storage medium allows to reduce the size of the system compared to the size of a system for a transmission type holographic storage medium, as all optical elements are arranged on the same side of the holographic storage medium. Furthermore, no additional hardware is necessary for shift multiplexing. A precise movement of the holographic storage medium is sufficient, which can easily be realized by rotating the holographic storage medium.

However, a big challenge for the reflection type coaxial systems is to increase the Signal to Noise Ratio (SNR) by attenuation of the different noises propagating on the same axis as the reconstructed object beam. Because of the small diffraction efficiency of the multiplexed holograms, the order of magnitude of the required attenuation is about $10^{-4}$ or $10^{-5}$.

SUMMARY OF THE INVENTION

It is an object of the invention to propose an apparatus for reading from and/or writing to a holographic storage medium with a coaxial arrangement of two or more reference beams and an object beam or a reconstructed object beam, which has an improved Signal to Noise Ratio.

According to the invention, this object is achieved by an apparatus for reading from and/or writing to a transmission type holographic storage medium, with a coaxial arrangement of two or more reference beams and an object beam or a reconstructed object beam, the reference beams being arranged on a circle around the object beam or the reconstructed object beam in a Fourier plane of the apparatus behind the holographic storage medium, in which a mirror is located in or close to the Fourier plane, the mirror being designed such that it reflects the object beam or the reconstructed object beam without reflecting the reference beams.

It has been found that for the common aperture system the reflection of the object beam is important for increasing the Signal to Noise Ratio, or for decreasing the Bit Error Rate (BER) or the Symbol Error Rate (SER). Therefore, it is desirable to maintain a reflection type system. However, the reflected reference beams are scattered and diffracted at the surfaces of the optical components of the system, which leads to noise and the necessity to filter out the reflected reference beams.

The invention overcomes this problem by using a transmission type holographic storage medium in combination with a specially designed mirror in the Fourier plane behind the holographic storage medium. Only the object beam or the reconstructed object beam is reflected back into the system towards the detector. The reference beams are coupled out at the Fourier plane, directly after forming a hologram or after reconstructing the object beam. As the reference beams do not propagate towards the detector, the diffraction noise caused by the reference beam on the detector surface is reduced. At the same time, only a relatively simple mirror is placed behind the transmission type holographic storage medium. Therefore, the system size does not change significantly in comparison to a reflection type system, where the entire optical elements are located at the same side of the holographic storage medium.

Advantageously, the mirror is a circular mirror with a diameter smaller than the diameter of the circle on which the reference beams are arranged. As the reference beams are arranged around the object beam or the reconstructed object beam, it is sufficient to reduce the diameter of the mirror up to the point where the reference beams are no longer reflected. This is preferably achieved by providing a transparent or absorptive substrate with a reflective coating in the appropriate circular area.

Favorably, the mirror acts as a Fourier filter for the object beam or the reconstructed object beam. This is possible by further reducing the diameter of the mirror up to the point where it does no longer reflect the higher Fourier components of the object beam or the reconstructed object beam. In this case the mirror is the reflective equivalent of a pinhole Fourier filter.

Alternatively, the mirror has dimensions larger than the diameter of the circle on which the reference beams are arranged. In this case non-reflective areas are located at least at the locations of the reference beams on the mirror.

The non-reflective areas are preferably areas without a reflective coating, which can be easily manufactured, or diffractive or refractive structures. In the latter cases the structures allow to direct the reference beams into desired directions, e.g. to control the intensity of the reference beams.

Preferably, the mirror is mechanically or electronically coupled to an objective lens. The apparatus has an objective lens for focusing the object beam and the reference beams into the holographic storage medium. This objective lens is generally movable for focusing and tracking, which means that positions of the object beam or the reconstructed object beam and the reference beams changes. Coupling of the mirror to the objective lens ensures the correct positioning of the object beam or the reconstructed object beam and the reference beams on the mirror.

Advantageously, the apparatus has four reference beams. Numerical simulations have shown that this is the optimal number of reference beams.

BRIEF DESCRIPTION OF THE DRAWINGS

For a better understanding the invention shall now be explained in more detail in the following description with reference to the figures. It is understood that the invention is not limited to this exemplary embodiment and that specified features can also expediently be combined and/or modified without departing from the scope of the present invention. In the figures.

DETAILED DESCRIPTION OF PREFERRED EMBODIMENTS

Figure 1:
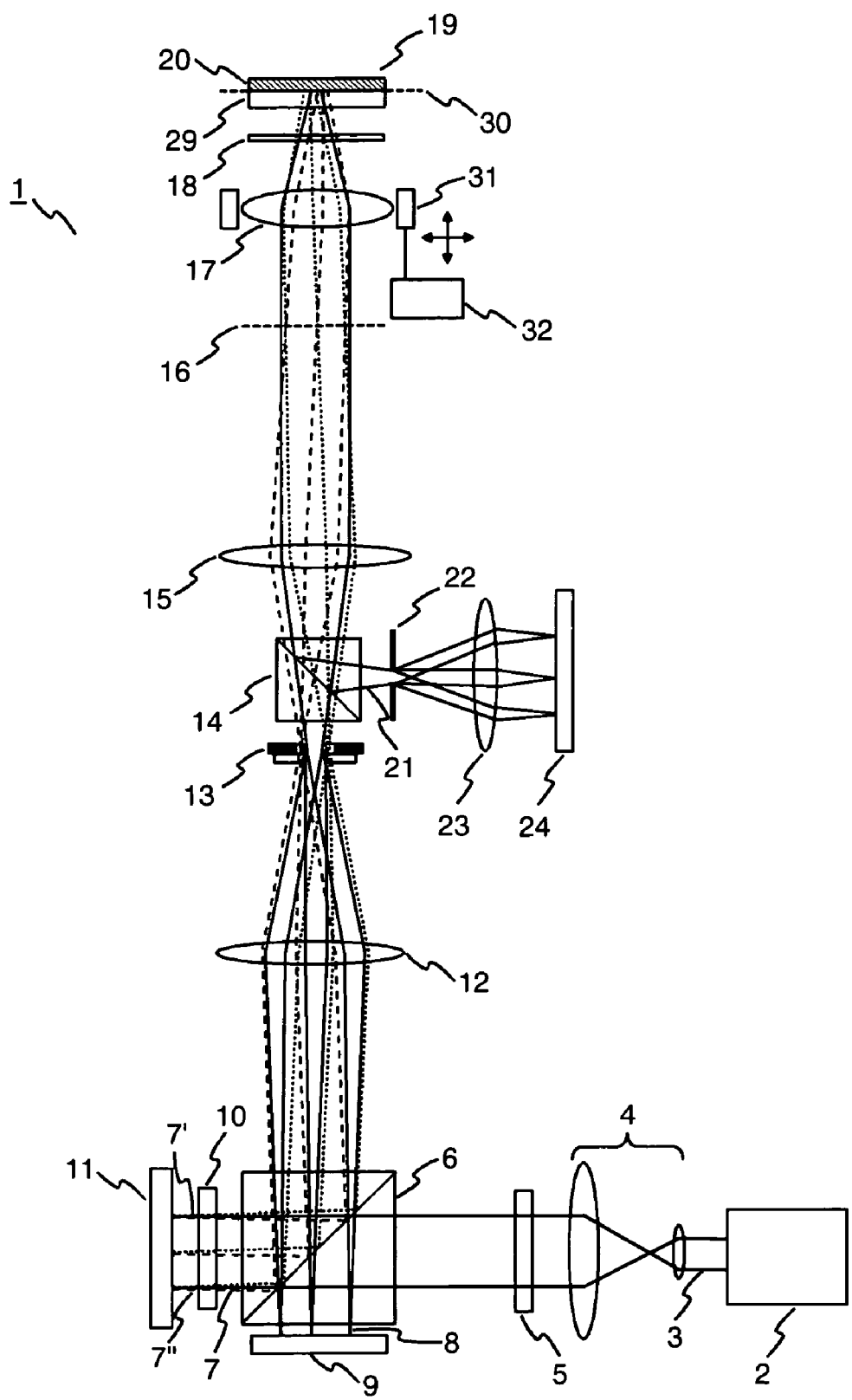
FIG. 1 illustrates a simplified setup of a known coaxial reflection type holographic storage system.

A simplified setup of a known coaxial reflection type holographic storage system 1 is illustrated in FIG. 1. For simplicity, an integrated servo system has been omitted in the figure. In the example the holographic storage system is a 12f system. A laser beam 3 emitted by a laser 2 is expanded by an optional beam expander 4 and divided into a reference beam 7 and an object beam 8 by a polarizing beam splitter (PBS) cube 6. A half wave plate 5 is located between the beam expander 4 and the PBS cube 6. The laser 2 emits a linearly polarized laser beam 3. By rotating the half wave plate 5 the polarization direction of the laser beam 3 can be rotated into an arbitrary direction. The PBS cube 6 divides the laser beam 3 into two orthogonal polarized (P and S polarized) laser beams 7, 8. The rotation of the half wave plate 5 allows to control the beam intensity ratio of the P and S polarized beams, or in other words the intensity ratio in the object arm and reference arm. For optimizing the readout diffraction efficiency it is desirable to optimize the intensity ratio during recording. The object beam 8 is directed onto a reflection type SLM 9 by the PBS cube 6. The reflection type SLM 9 not only imprints a data page on the object beam 8, but also changes the direction of polarization of the object beam 8. In this regard the reflection type SLM 9 acts as a half wave plate. After reflection from the SLM 9, the object beam 8 passes through the PBS cube 6 and is combined with the reference beam 7. In the optical path of the reference beam 7 there are a quarter wave plate 10 and a reflection type diffraction beam generator 11. The beam generator 11 reflects two or more well-defined diffraction orders, which are circularly shaped tilted plane waves propagating in well-defined directions. Numerical simulations have shown that the optimal number of reference beams is four. Therefore, the beam generator 11 preferably generates four reference beams 7', 7", two of which are illustrated in the figure. Due to the practical realization of the beam generator 11 also the zero-order diffraction beam appears, though with low diffraction efficiency. This beam is suppressed in the further part of the optical system.

As indicated before, the object beam 8 and the reference beams 7', 7" are coupled into the main coaxial arrangement by the PBS cube 6. Following this PBS cube 6 there is a first long focal length objective 12. Long focal length in this case means that the focal length is long enough to place additional optical components between the lens and the focus without having too much aberrations. Long focal length objectives have the advantage that their fabrication is simple and requires less optical elements. In addition, the diameter of the Fourier plane of a long focal objective is large, which simplifies the fabrication of filters placed into the Fourier plane as the fabrication tolerances are reduced. This first objective 12 generates the Fourier transform of the SLM 8 at its back focal plane, which is the first Fourier plane of the 12f system and the Fourier plane of the SLM 8. The first objective 12 also focuses the multiple reference beams 7', 7" into the first Fourier plane. Located in this first Fourier plane is an in-coupling filter 13, which is designed such that it low-pass filters the object beam 8 and rotates the polarization of the reference beams 7', 7" without rotating the polarization of the zero order component of the reference beam. The in-coupling filter 13 will be explained below in more detail with reference to FIGS. 2 and 3.

After passing the in-coupling filter 13 the object beam 8 and the reference beams 7', 7" pass through a second PBS cube 14. As the zero order component of the reference beam is orthogonal to the other beams 7', 7", 8, the second PBS cube 14 transmits the low-pass filtered object beam 8 and the diffracted reference beams 7', 7", but reflects the zero order component of the reference beam out of the optical system. A second long focal length objective 15 after the PBS cube 14 retransforms the SLM image onto an intermediate object plane 16 and generates again circularly shaped tilted plane waves from the focused reference beams 7', 7". A high NA Fourier objective 17 transforms the SLM image onto a mirror layer 20 of a holographic storage medium 19 located in a second Fourier plane 30. The position of the high NA Fourier objective 17 is adjusted with an actuator 31, which is controlled by a servo circuit 32. During writing the object beam 8 interferes within a hologram layer 29 of the holographic storage medium 19 with the direct reference beams 7', 7" and the reference beams reflected by the mirror layer 20. During reading a reconstructed object beam 21 is retransformed by the high NA Fourier objective 17 onto the intermediate image plane 16. For better clarity, as in the figure the reconstructed object beam 21 coincides with the object beam 8, the reference numeral for the reconstructed object beam 21 is drawn behind the PBS cube 14. A quarter wave plate 18 is located between the high NA Fourier objective 17 and the holographic storage medium 19. As the beams pass through this quarter wave plate 18 twice, the polarization direction of the reconstructed object beam 21 is orthogonal to the polarization direction of the original object beam 8. The reconstructed object beam 21 is again Fourier transformed by the second long focal length objective 15. Due to the rotation of the polarization, the PBS cube 14 reflects the reconstructed object beam 21 onto an out-coupling filter 22, which is located in a third Fourier plane of the 12f system. The out-coupling filter 22 blocks the reflected reference beams, thus only the reconstructed object beam 21 is imaged onto a detector array 24 by a third long focal length objective 23.

Figure 2:
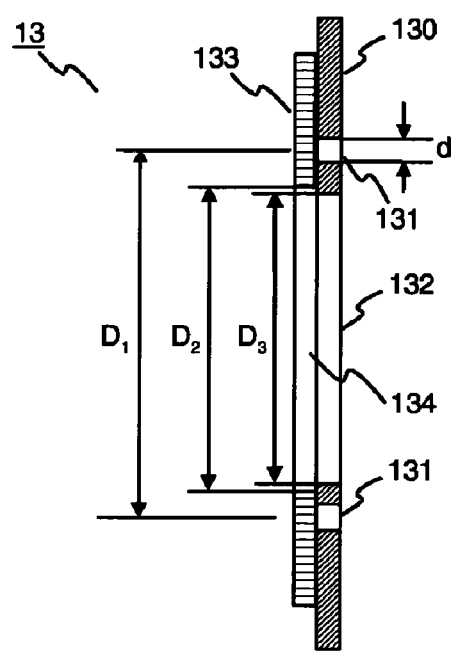
FIG. 2 shows a cross-sectional view of the in-coupling filter with the ring type half wave plate.

FIG. 2 shows a cross sectional view of the in-coupling filter 13 located in the first Fourier plane of the 12f optical system. It includes a beam block 130, e.g. a thin black metal plate or a transparent substrate with a reflective or absorbent layer, with a central aperture 132 with a diameter $D_3$ for the object beam 8 and the zero order reference beam, and holes 131 with a diameter d for the reference beams 7', 7". A ring type half wave plate 133 is arranged on the beam block 130. The ring type half wave plate 133 has a central aperture 134 with a diameter $D_2$. The object beam 8 and the zero order component of the reference beam pass through this central aperture 134 without any modification, and also pass through the central aperture 132 of the beam block 130. The central aperture 132 acts as a low-pass filter for the object beam 8, because it cuts the higher Fourier components of the object beam 8. The remaining reference beams 7', 71" pass through the half wave plate 133, which rotates the direction of polarization of these beams 7', 7". Before the first Fourier plane the directions of polarization of the object beam 8 and the reference beams 7', 7" are orthogonal. The ring type half wave plate 133 rotates the direction of polarization of the diffracted reference beam 7', 7", while the low energy zero order component of the reference beam conserves its direction of polarization. Arranged on a ring with the diameter D1 around the central aperture 132 of the beam block 130 there are holes 131 for the diffracted reference beams 7', 7". Thus the filter 13 in the first Fourier plane transmits the diffracted reference beams 7', 7" as well as the zero order component of the reference beam, and also transmits the low-pass filtered object beam 8. Because of the ring type half wave plate 133 the direction of polarization of the zero order component of the reference beam is orthogonal to the direction of polarization of the other beams 7', 7", 8. Therefore, the PBS cube 14 after the filter 13 transmits the low-pass filtered object beam 8 and the diffracted reference beams 7', 7", whereas it reflects the zero order component of the reference beam out of the optical system. In the figure the central aperture 132 is circular, which fits best to the circular apertures of the lenses of the optical setup. However, the aperture 132 may also be elliptical, e.g. when the tips of the reference beams 7', 7" are arranged on an ellipse. Furthermore, the aperture may also have a square or rectangular shape, which fits better to the diffraction image of the SLM 9 with its square or rectangular pixels. The apertures 131 for the reference beams 7', 7" may be switchable apertures. This is advantageous for special multiplexing schemes.

Figure 3:
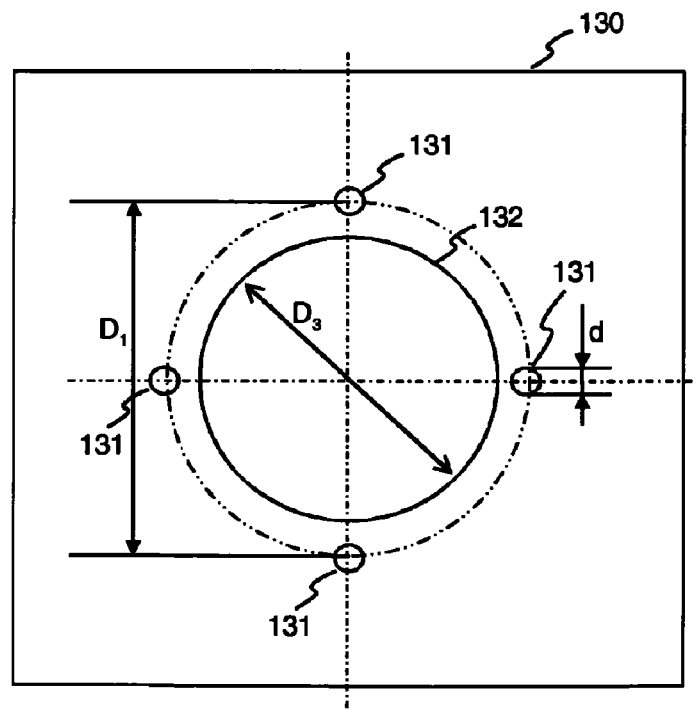
FIG. 3 shows a top view of the in-coupling filter in case of four reference beams.

FIG. 3 shows the top view of the beam block 130 of the in-coupling filter 13 for the case of four reference beams 7', 7". The holes 131 for the reference beams 7', 7" are arranged on a circle with the diameter $D_1$. The diameter of the central aperture 132 is $D_3$. The difference of the diameters ($D_1$-$D_3$) is about 40-100 μm. The diameter d of the holes 131 for the reference beams 7', 7" is about 10-100 μm. Of course the number of reference beams 7', 7" is not limited to four reference beams 7', 7".

Figure 4:
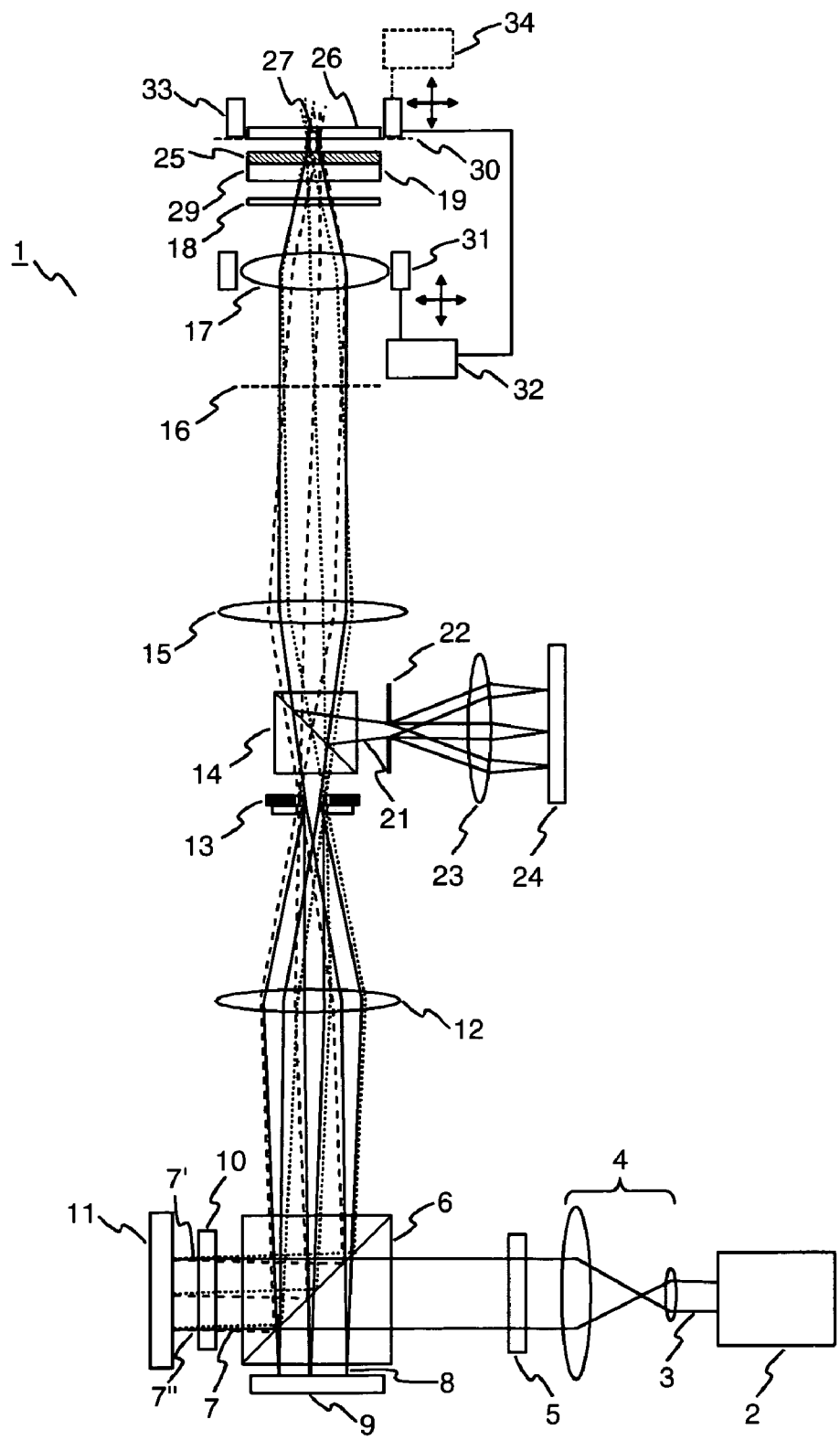
FIG. 4 depicts a simplified setup of a coaxial reflection type holographic storage system according to the invention.

FIG. 4 depicts a simplified setup of a coaxial reflection type holographic storage system 1 according to the invention. The system 1 is essentially the same as the system of FIG. 1. However, instead of a reflection type holographic storage medium 19 with a reflective layer 20 a transmission type holographic storage medium 19 with a transparent substrate 25 is used. The high NA Fourier objective 17 transforms the SLM image through the transmission type holographic storage medium 19 onto the second Fourier plane 30. Located in this second Fourier plane 30 is a specially shaped mirror 27 arranged on a transparent substrate 26. The mirror 27 has a circular shape with a diameter essentially equal to the diameter of the low pass filtered object beam 8. This means that the mirror 27 is the reflective equivalent of a Fourier filter aperture. The mirror 27 reflects the object beam 8, but the focused reference beams 7', 7" leave the system near this mirror 27 through the transparent substrate 26. It is likewise possible to use an absorptive substrate instead of the transparent substrate 26. It just needs to be ensured that the reference beams 7', 7" are not reflected back into the system. As the high NA Fourier objective 17 is moved by the actuator 31, the mirror 27 needs to follow this movement, i.e. the high NA Fourier objective 17 and the mirror 27 are fixed relative to each other. This is achieved by mechanically coupling the mirror 27 and the high NA Fourier objective 17, or by providing the mirror 27 with an additional actuator 33. This additional actuator 33 is either controlled by the servo circuit 32 of the high NA Fourier objective 17, or by an additional servo circuit 34. The additional servo circuit 34 preferably uses the transmitted reference beams 7', 7" for controlling the position of the mirror 27.

Figure 5:
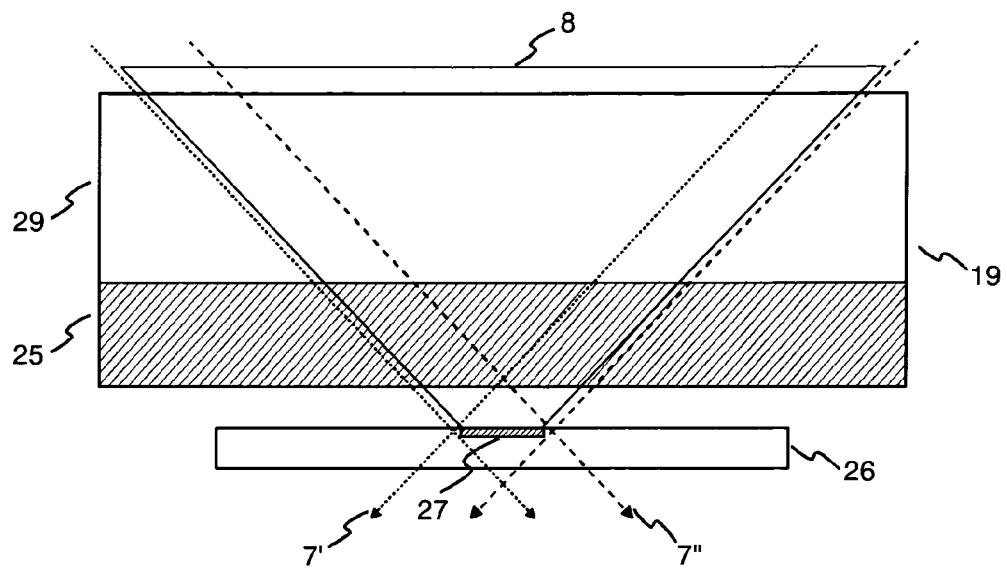
FIG. 5 shows an enlarged side view of the object and reference beams at the position of the holographic storage medium.

An enlarged side view of the object beam 8 and the reference beams 7', 7" at the position of the holographic storage medium 19 is shown in FIG. 5. During writing of a hologram the direct and reflected object beams 8 overlap with the direct focused reference beams 7', 7" and form an interference pattern (hologram) in the storage material 29.

During reading, only the reference beams 7', 7" illuminate the hologram. The reconstructed direct and reflected object beams 21 are retransformed by the high NA Fourier objective 17 onto the intermediate image plane 16. No reflected reference beams are present, as the focused reference beams 7', 7" are not reflected by the mirror 27.

Figure 6:
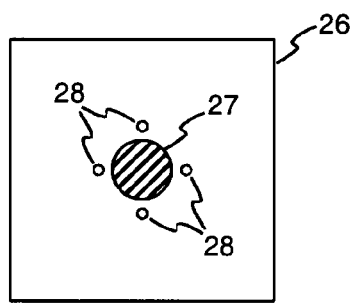
FIG. 6 depicts a top view of a circular mirror located in the Fourier plane behind the holographic storage medium.

A top view of the circular mirror 27 is depicted in FIG. 6. The mirror 27 is arranged on a transparent or absorbing substrate 26. The small circular areas 28 indicate the positions of the four reference beams 7', 7" on the substrate 26. As can be seen, the reference beams 7', 7" do not impinge on the mirror 27.

Figure 7:
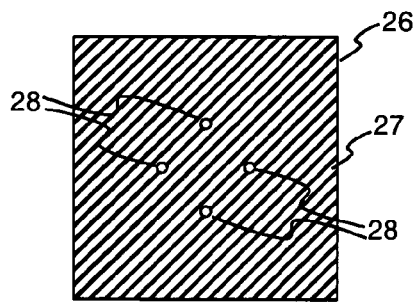
FIG. 7 shows an alternative solution for the mirror located in the Fourier plane behind the holographic storage medium.

Instead of the small circular mirror 27 it is likewise possible to use a larger mirror with holes for transmitting the reference beams 7', 7". This is depicted in FIG. 7. The whole substrate 26 except for the locations 28 of the reference beams 7', 7" is provided with a reflective coating. In this case, however, the mirror 27 does not act as a Fourier filter for the object beam 8. In addition, instead of coupling the reference beams 7', 7" out of the system by letting them pass through the substrate 26, the reference beams 7', 7" can also be coupled out using diffractive or refractive structures at the position locations 28 of the reference beams 7', 7", e.g. gratings or prisms.

Figure 8:
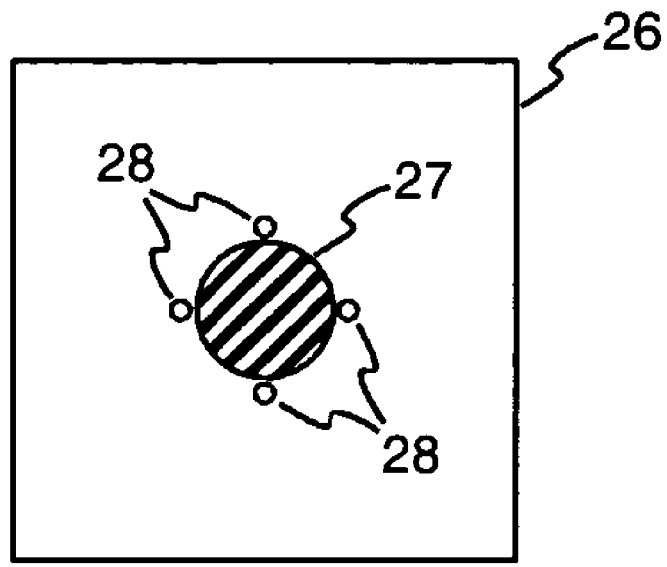
FIG. 8 depicts a further solution for the mirror located in the Fourier plane behind the holographic storage medium.

In order to avoid the coupling of the high NA Fourier objective 17 and the mirror 27, it is possible to increase the size of the mirror 27. This is depicted in FIG. 8. If the distance between the object beam 8 or the reconstructed object beam 21 and the reference beams 7', 7" is not too small, a slight movement of the high NA Fourier objective 17 does not need to be compensated. The object beam 8 or the reconstructed object beam 21 remain on the mirror 27, while the reference beams 7', 7" still do not impinge on the mirror 27.

Figure 9:
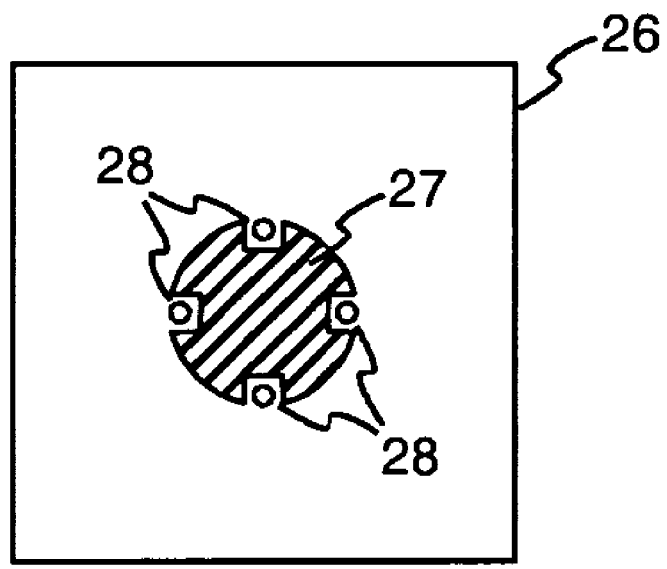
FIG. 9 shows still a further solution for the mirror located in the Fourier plane behind the holographic storage medium.

FIG. 9 shows a further improved-solution for the mirror 27, which allows for a larger displacement of the high NA Fourier objective 17. In this case the mirror is further enlarged, but has special cut-outs for the reference beams 7', 7".

What is claimed, is:

1. Apparatus for reading from and/or writing to a transmission type holographic storage medium, with a coaxial arrangement of two or more reference beams and an object beam or a reconstructed object beam, the reference beams being arranged on a circle around the object beam or the reconstructed object beam in a Fourier plane of the apparatus behind the holographic storage medium, wherein a mirror is located in or close to the Fourier plane, wherein the mirror is designed such that it reflects the object beam or the reconstructed object beam without reflecting the reference beams.

2. Apparatus according to claim 1, wherein the mirror is a circular mirror with a diameter smaller than the diameter of the circle on which the reference beams are arranged.

3. Apparatus according to claim 2, wherein the mirror is a Fourier filter for the object beam or the reconstructed object beam.

4. Apparatus according to claim 2, wherein the mirror is arranged on a transparent or absorptive substrate.

5. Apparatus according to claim 1, wherein the mirror has dimensions larger than the diameter of the circle on which the reference beams are arranged, and wherein non-reflective areas are located at least at the locations of the reference beams on the mirror.

6. Apparatus according to claim 5, wherein the non-reflective areas are areas without a reflective coating, or diffractive or refractive structures.

7. Apparatus according to claim 1, wherein the mirror is mechanically or electronically coupled to an objective lens.

8. Apparatus according to claim 1, wherein the apparatus has four reference beams.

* * * * *